United States Patent
Fitzhenry et al.

(10) Patent No.: US 6,766,503 B2
(45) Date of Patent: Jul. 20, 2004

(54) METHOD AND APPARATUS FOR CIRCUIT DESIGN

(75) Inventors: Neal Fitzhenry, Bristol (GB); Peter William Hughes, Bristol (GB); Simon Christopher Dequin Clemow, Bristol (GB); Paul Andrew Freeman, Gloucestershire (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/158,000

(22) Filed: May 31, 2002

(65) Prior Publication Data

US 2002/0184601 A1 Dec. 5, 2002

Related U.S. Application Data

(60) Provisional application No. 60/295,008, filed on Jun. 4, 2001.

(51) Int. Cl.[7] .............................................. G06F 17/50
(52) U.S. Cl. ................. 716/12; 716/1; 716/13
(58) Field of Search .................... 716/1, 8–15

(56) References Cited

U.S. PATENT DOCUMENTS

| | | | | |
|---|---|---|---|---|
| 5,196,362 A | * | 3/1993 | Suzuki | 716/12 |
| 5,894,165 A | * | 4/1999 | Ma et al. | 257/666 |
| 6,182,272 B1 | * | 1/2001 | Andreev et al. | 716/13 |
| 6,189,131 B1 | * | 2/2001 | Graef et al. | 716/8 |
| 6,496,968 B1 | * | 12/2002 | Yamada et al. | 716/12 |

* cited by examiner

Primary Examiner—Matthew Smith
Assistant Examiner—Paul Dinh
(74) Attorney, Agent, or Firm—Sterne, Kessler, Goldstein & Fox P.L.L.C.

(57) ABSTRACT

A method for designing multi-layer electronic circuits includes defining a plurality of circuit blocks in terms of physical boundaries, the plurality of circuit blocks including a first circuit block with at least one port for connecting to a portion of inter-block routing having conducting material external to the first circuit block. The method further provides protective routing for the at least one port of the first circuit block in a region between the block and the inter-block routing, wherein circuitry within the first circuit connected to the at least one port is not in-circuit with the conducting material of the inter-block routing during processing steps involving the conducting material. The protective routing is a conducting layer which is higher in the multi-layer structure than the highest conducting layer used for routing the net containing the at least one port for inter-block routing. The protective routing also bridges the at least one port to inter-block routing connected to the net in a halo region. Software and/or a computer program product that can be used for multi-layer circuit design is also described.

11 Claims, 7 Drawing Sheets

METHOD AND APPARATUS FOR CIRCUIT DESIGN

CROSS-REFERENCE TO RELATED APPLICATIONS

This application claims the benefit of U.S. Provisional Application No. 60/295,008, filed on Jun. 4, 2001, which is incorporated herein by reference.

BACKGROUND OF THE INVENTION

1. Field of the Invention

This invention relates to a method and apparatus for designing circuits and in particular to a method for designing integrated circuits according to a hierarchical block-based design method.

2. Related Art

As circuit design environments become increasingly competitive there is increasing pressure to bring devices implementing the circuits to market quickly and profitably. Todays sub micron technologies may employ processor cores, general purpose circuit blocks and dedicated functional units designed specifically for the intended applications. Integrated circuit designs frequently also include analog circuit blocks such as analog to digital converters, digital to analog converters and phase locked loops. The resulting circuit may incorporate several million gates and would typically operate at clock speeds above 100 MHz. Unnecessary delays in timing convergence or chip assembly are undesirable and can turn out to be costly. Integrated circuit designers working at sub micron dimensions face challenges in implementing and optimizing working chips of such complexity. Circuit design presents considerable difficulties in managing physical implementation to achieve timing convergence. A conventional design process begins with logic synthesis followed by a physical design phase employing place and route procedures. Problems solved during the place and route procedures often require modifications to be made in a further logic synthesis stage and vice versa. Typically iterations through logic synthesis and physical design stages are required.

The definition of a block varies. However in general a block may be regarded as a circuit element comprising anywhere from an individual cell or several cells upwards to thousands of cells. Block-based design methods have been developed to reduce the number of iterations required between logic synthesis and physical implementation stages of integrated circuit design flow. These design methods might employ automatic software tools to generate candidate floorplans for implementing the integrated circuit. The floorplanning tools are integrated with a range of other software tools for designing detailed circuit implementations within each block. Designers can build a floorplan for the integrated circuit by defining high-level descriptions of the blocks. In practice, this is done either by generating new views of blocks or by re-using proven design blocks from previous designs. Block-based design environments allow integrated circuits to be defined in terms of blocks, sub-block descriptions, or actual layouts with parasitics.

Block-based (or hierarchical) design flows reduce the number of iterations required between logical synthesis and physical implementation stages of chip design. Thus in any given design process, a great deal of the time saved is achieved through the use of these automated software tools for designing and updating floorplans. The advantage is that block-based design flows enable concurrent development of the high level design and the individual blocks which make up that design. A problem with existing block-based design flows is that it is difficult to complete blocks of a chip design and join them together, without knowing the detailed internal physical implementation of each block. One reason for this is that silicon MOS devices can be damaged during their fabrication by what is known as the "antenna effect". Charge which accumulates on exposed metal surfaces (for example during etching processes) can be discharged through MOS gate material which causes yield loss or failures of the silicon product. Circuit design rules include a set of rules which, if followed, protect the circuit from antenna-related problems. Design flows usually include a verification step which checks that these antenna rules have been complied with.

For MOS process technologies, the antenna effect is caused by charge induced sequentially by and in proportion to the amount of exposed metal track connected to a MOS gate at each photo/etch stage. Modem MOS processes use a number of metal interconnect layers and the amount of exposed metal at each metal etch stage is a useful indication of damage probability. Whenever blocks are joined together in block-based design flows, gates within a block can be damaged by antenna effects of the exposed metal external to the block. The charge accumulates at the metal making the internal connection from the port to the MOS gate. Known design flows cannot prevent antenna failures of this type without knowledge of the detailed characteristics of internal and external metal tracking and the amount of gate material connected within a block. Unfortunately this information is not always available early enough in the design process and the result is an antenna failure during high-level design checks. This requires another iteration of the design process, possibly involving an iteration of the sub-block level design. Antenna fails of this type can lead to a significant delay in chip design processes, and due to the random nature of automated place and route flows these iterations may not be convergent towards a solution.

This invention seeks to provide an improved method and apparatus for circuit design with particular applications in integrated circuit design.

BRIEF SUMMARY OF THE INVENTION

According to an aspect of the present invention there is provided a method for designing multi-layer electronic circuits, the method including a block-based physical design stage. The design method includes defining a plurality of circuit blocks in terms of physical boundaries, the plurality of circuit blocks including a first circuit block with at least one port for connecting to a portion of inter-block routing comprising conducting material external to the first circuit block. The method further provides protective routing for the at least one port of the first circuit block in a region between the block and the inter-block routing, wherein circuitry within the first circuit block and connected to the at least one port is not in-circuit with the conducting material of the inter-block routing during processing steps involving conducting material.

In one aspect of the invention, providing the protective routing includes the step of connecting the at least one port to a portion of a conducting layer which is higher in the multi-layer structure than the highest conducting layer used for routing the net containing the at least one port for inter-block routing.

Another aspect of the invention provides a method of circuit design for a multi-layer circuit. The design method includes defining one circuit block of a plurality of circuit blocks, the one circuit block having a port for connecting a portion of the one circuit block to inter-block routing. Routing layers are determined in the plurality of circuit blocks that are connected to the port of the circuit block. A bridging layer is selected that is a conducting layer of the multi-layer circuit, where the bridging layer is higher than any routing layer connected to the port of the circuit block. The port of the circuit block is connected to the bridging layer using a first interlayer connection, and the bridging layer is connected to the inter-block routing using a second interlayer connection.

Another aspect of the invention includes a multi-layer circuit that is designed according the method described herein. The multi-layer circuit includes a first circuit block having one or more first routing layers and a first port connected to at least one of the first routing layers. Inter-block routing connects the first port to another circuit block of the multi-layer circuit. A halo region connects the first port to the inter-block routing. The halo region includes a second routing layer that is higher than any routing layer in the first circuit block and the second circuit block that is connected to the first port and the inter-block routing. A first interlayer connects the first port to the second routing layer, and a second interlayer connection connects the second routing layer to the inter-block routing. A portion of the second routing layer between the first interlayer connection and the second interlayer connection is isolated from the rest of the second routing layer to form a bridge between the first interlayer connection and the second interlayer connection. Since the second routing layer is on a higher layer of the multi-layer circuit than the first routing layers, the antenna effects are mitigated and the gates in the first circuit block are protected during the fabrication process.

The halo region can be repeated for each port of the circuit block(s) in a multi-layer circuit. The protective halo therefore ensures independent blocks are electrically isolated from each other during the critical processing steps which have the potential to cause failure due to antenna related effects. Designers can therefore complete blocks in advance of them being connected together, without knowing the detailed characteristics of the antenna tracking or the amount of gates connected to tracks outside of each of the blocks. Another advantage of the technique is that antenna problems caused by inter block routing interacting with existing block level routing can be solved even if it is not possible to modify the internal block routing, e.g., in an imported hard macro block. This can often be the case if sub-block level designs are designed by third parties.

Another aspect of the invention includes a computer program product embodied on a computer program medium having computer program code for designing a multi-layer circuit. The computer program code includes a means for causing a computer to define a plurality of circuit blocks, each circuit block having one or more routing layers and at least one port. The computer program product further includes a means for causing the computer to define a net from the plurality of circuit blocks, the net having a plurality of the ports from the plurality of circuit blocks that are to be connected by the inter-block routing. The inter-block routing further includes a means for causing the computer to determine a bridging layer for one port of the plurality of ports, the bridging layer being a conductive layer that is higher than any routing layer on the net that is connected to the one port.

Additional advantages and novel features of the invention will be set forth in part in their description which follows, and in part will become apparent to those skilled in the art upon examination of the following and the accompanying drawings. The features and advantages of the invention may be realized and attained by means of the various apparatus definitions and method steps, particularly pointed out in the appended claims.

BRIEF DESCRIPTION OF THE DRAWINGS

Embodiments of the present invention will now be described by way of example only, with reference to the accompanying drawings in which.

DETAILED DESCRIPTION OF THE INVENTION

The various aspects of the invention relate to a block-based integrated circuit design method and/or associated methods for designing circuitry, which provide a time-saving in the design flow process. Reference is now made in detail to the embodiments of the present invention, examples of which are illustrated in the accompanying drawings and discussed below.

Block-based design flows enable design processes to be performed at a high level and at lower levels at the same time. Design flows are partitioned at block level so detailed physical implementations can be developed within two or more blocks at the same time. A block defines a portion of a circuit with exterior walls defined in terms of physical boundaries for design purposes. In addition, integration between logical synthesis stages and physical design stages ensures that critical physical information is available to the designer earlier in the design process. The result is that designs achieve target specification faster.

Figure 1:
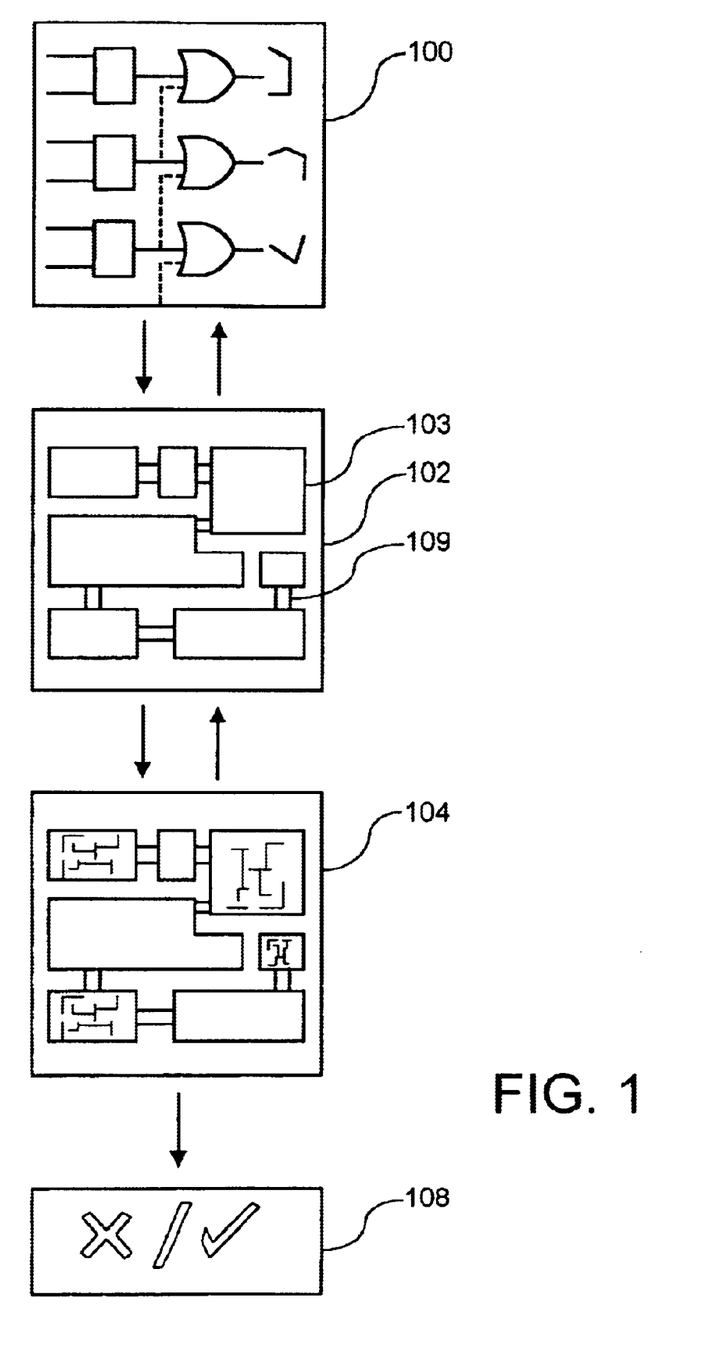
FIG. 1 is a block diagram schematically illustrating a chip design process.

FIG. 1 schematically illustrates a hierarchical physical design flow. The first design stage is a physical chip description 100 that describes the physical description and boundary of the circuit using a comprehensive set of design tools. Then the design process moves to the netlist build and physical build stages. In a first netlist build stage, a block-based design approach 102 is used to generate one or more candidate floorplans for the lower level blocks. Each floorplan has multiple circuit blocks 103 that contains the physical layout of a portion of the circuit. The blocks 103 are electrically and physically connected by conductive routing 109 as shown. Each block 103 can be designed simultaneously and independently of each other because the inputs and outputs are predefined. The pins of the blocks can also be defined at this stage. Thereafter, a sub-block level design approach 104, possibly cell-based, hand crafted, or an imported hard macro is used to fill in implementation details for the various blocks making up the floorplan.

At any given stage in the design flow changes or minor modifications to the physical implementation may require that the design flow reverts to an earlier stage. Likewise changes or minor modifications to the logical circuit design have repercussions in the physical design stage. The same applies to changes and modifications between the high-level and low-level stages of the physical synthesis. Once the design has achieved specification at all levels, final verification is performed at step 108. It will be apparent that before the high-level design is substantially complete the block-based hierarchy permits high-level and low-level designers to work on the design and/or different circuit blocks at the same time. Further, as designers refine individual circuit blocks, the results are immediately visible in the high-level design. Likewise, any high-level changes to the floorplan or global routing are made visible to the relevant blocks. The design process can thus be driven from chip level by selecting a floorplan and allocating timing or physical constraints for each block to meet. Detailed implementations of the various blocks can then be designed substantially independently.

In general, designers set out a desired floorplan at chip level, focussing at first on the net list for the integration of blocks. The desired floorplan will be a function of various connectivity and inter-block considerations such as the number of pins, connectivity and input/output ports. Pin optimization and power supply definition can be handled during this early stage. This early stage thus generates physical boundaries for the blocks as well as timing constraints for block implementation. Designers use specifications for each block set to define target timing relationships for the pins of each block. This requires information on clocking and signal input/output mechanisms outside the block. This information is used to build a crude timing model at high level to determine if the circuit will meet a global timing specification.

Next top-level block implementation begins. Refinements to high-level routing take into account more detailed implementations of, for example, power supplies and analog blocks. The block level implementation may be designed using a method for the circuit, e.g. logical synthesis and automatic place and route, or hand designing. At any stage the automatic floorplanning facility ensures that changes or modifications at sub-block or block-level are taken into account by the high-level floorplan. Therefore, as designers provide detailed implementations for blocks the high-level design is continually updated, and vice-versa. When the physical implementation of the design at both high-level and lower-level meets all specifications and fabrication constraints, the circuit design is completed and signed off. In practice, it takes many iterations of the various design stages to achieve this due to complex interactions between different parts of the chip or when designers cannot modify the internal block structure, for example because a hard macro has been used.

The number of iterations required in the design process is reduced in embodiments of the invention by a design mechanism which eliminates or reduces antenna failures caused by tracking or other conducting material external to the block. In embodiments, additional protective routing is provided early in the design flow, for example in the floorplanning stage, when netlist build and pin definition is occurring. This provides further autonomy to the designers of individual blocks who need not consider inter-block connectivity issues, nor detailed implementations within neighboring blocks when implementing blocks. This reduces the number of iterations required in a design flow.

In order to protect the gates within a block from antenna effects caused by external tracking (for example tracking which routes signals between blocks and tracking within other blocks) the designer in effect disconnects the track routed between the two blocks from the external ports of the block containing the gates. For example, referring to FIG. 1, the designer disconnects the conductive tracks 109 from any block 103 that contains a gate that could be damaged by the antenna effect. This means the charge-inducing track is not in-circuit with a gate during the fabrication steps which may cause the antenna-related damage. In order to ensure the correct connectivity between blocks is achieved, each port going into or out of the block is pre-routed to a protective structure which takes the metal connection to the port from its original layer up to a higher metal layer. This higher metal layer makes a bridge and is then connected to the original port metal layer before inter block routing commences. The resulting protective structure may be regarded as a "halo" of fixed routing connections which surrounds the edges of the block.

Figure 2:
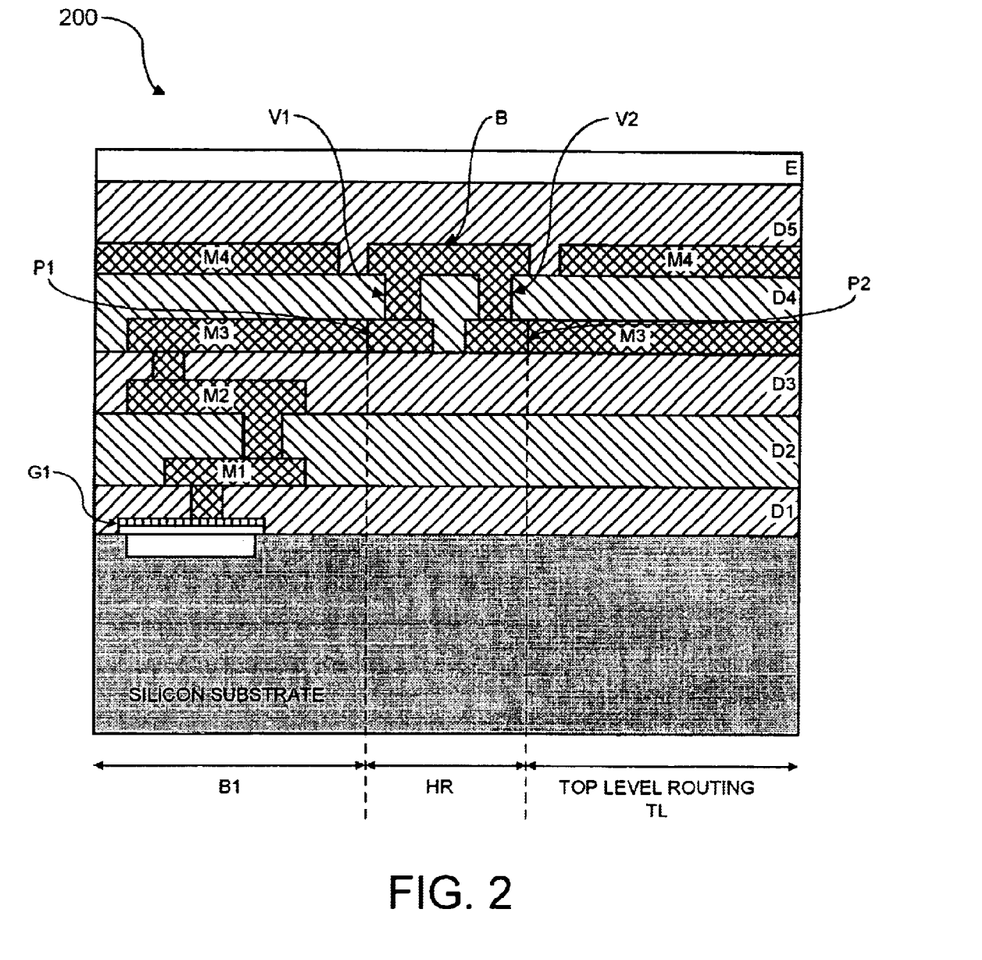
FIG. 2 is a sectional view through a portion of a multi-layer integrated circuit incorporating a block and some inter-block routing.

FIG. 2 shows a portion of a multi-layer silicon device 200. The proportion shown is divided into a block B1, and some inter-block routing that is separated from the block B1 by a halo region HR. FIG. 2 illustrates inter-block routing between block B1 and another block that is not shown. In embodiments of the invention, the inter-block routing occurs at the top level of the design hierarchy, in which case, the inter-block routing can be referred to as top level routing TL. Referring to level 102 in FIG. 1, the routing 109 between blocks 103 is top-level routing.

The device 200 includes a silicon substrate, a plurality of gates of which only one G1 is shown, a plurality of metal layers M1 to M4 disposed between dielectric layers D1 to D5, and an encapsulation layer E. The gate G1 in the first block B1 is connected to the external port P1 through the metal layers M1, M2 and M3. Accordingly, the gate G1 of the first block B1 would be vulnerable to antenna effects occurring on any tracking external to B1 and connected to the port P1. In practice each block is likely have thousands of gates and a plurality of ports. This device is an example of a device having partitioned routing such that one or more upper layers of metal are not used as routing layers within blocks. For example, M4 is an upper metal layer that is not used as a routing layer within the block B1. Furthermore, the M4 layer is higher than any routing layer within the block B1 (or any other block) that is connected to port P1.

The layer M4 might ordinarily be used for conveying a clock signal, a global signal or power tracks across the top level of the chip, i.e. among several blocks. Rather than connecting the external port P1 of the first block B1 directly into the inter-block routing of the layer M3, a metal connection V1 is pre-routed to take the metal connection of the port from the third metal layer M3 up to the higher metal layer M4 and then back down to the metal layer M3 by means of further pre-routing metal connection V2. The metal connections V1 and V2 can also be referred to as interlayer connections V1 and V2. The protective routing structure V1, B, and V2 is contained in a halo region HR defined between the external physical boundary of the block B1 and the physical boundary at which inter-block routing commences.

Figure 3:
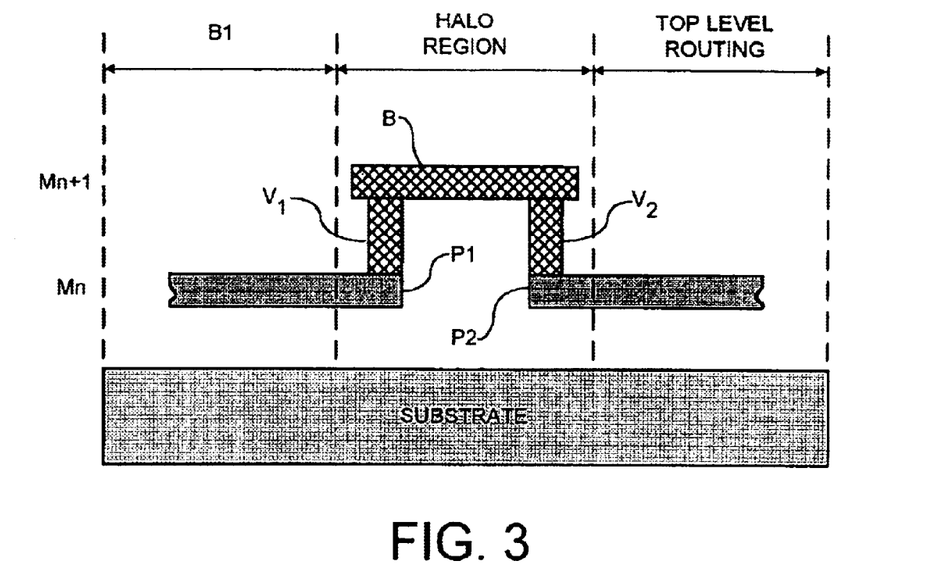
FIG. 3 is a schematic diagram illustrating a simplified sectional side view through a portion of a circuit having a protective routing halo in accordance with embodiments of the present invention.
Figure 4:
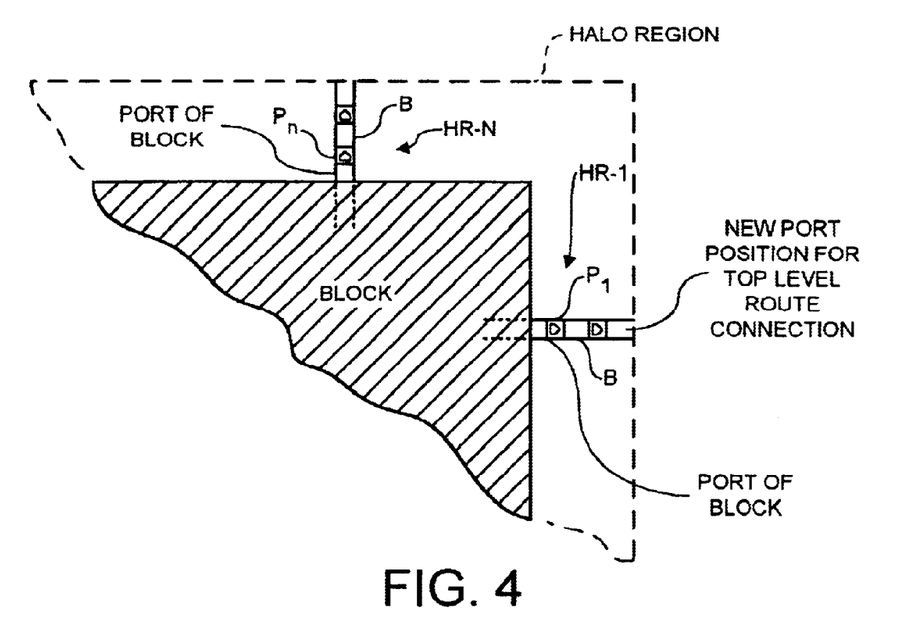
FIG. 4 is a schematic diagram illustrating a portion of a block surrounded by a protective routing halo in accordance with embodiments of the present invention.

As can be seen from FIGS. 3 and 4 for each block of the chip, each port going into or out of the block B1 is pre-routed to a halo structure (i.e. protective routing structure) HR. For example, referring to FIG. 4, the port P1 is routed to a halo structure HR-1, and the port-N is routed to a halo structure HR-N. The halo structure HR-1 protects the port 1 from antenna effects during fabrication of any conductive tracks in the inter-block routing or other blocks that might be connected to port 1, and HR-N provides the same protection for port N. In three dimensions, the protective routing structure takes the shape of a halo surrounding the block and filling the gap between the block B1 and the inter-block routing portion. In each case, the halo structure may be defined manually, or by specifically designed computer algorithms. The fundamental structure is one which meets the "bridge" function described further herein. Subsequent to the generation of the halo structure around each block to be connected at the level above, a commercial routing tool can be used to connect up each of the blocks.

Referring to FIG. 3, the highest routing layer connected to the port P1 of the block B1 is on layer $M_N$. The upper layer $M_{N+1}$ is selected to form part of the high metal bridge B and is at least one layer above the highest routing layer $M_N$ that is connected to the port P1. In determining the bridging layer $M_{N+1}$, consideration is given to routing layers in other circuit blocks (besides B1) that are connected to P1 through inter-block routing. Furthermore, consideration is also given to any inter-block routing that is connected to P1 via the bridging layer. In other words, the highest layer connected to port P1 could be in the block B1, or it could be inter-block routing, or it could be in another circuit block that is connected to P1 via inter-block routing. Once MN is determined, then the bridging layer for port 1 is selected to be at least one layer above $M_N$ (e.g. $M_{N+1}$). In other words, if the layer N is the highest routing layer connected to port P1, then it is sufficient to pre-route the metal connection of the port P1 up to the routing layer n+1 and to ensure that sufficient routing is placed in the n+1 layer to act as a bridge to establish the desired connectivity. This ensures the final device has the correct connectivity.

In another version of the method, a software tool keeps a record for each port on each block of the highest routing layer used inside the block. Using this information it is possible to generate a bridging halo by pre-routing to the highest of:
   (i) each block connection for a net (namely, each port of the block connected externally); and
   (ii) the highest required metal for routing that net during top-level routing.

The protective halo therefore ensures independent blocks are electrically isolated from each other during the critical processing steps which have the potential to cause antenna failure. Designers can therefore complete blocks in advance of them being connected together, without knowing the detailed characteristics of the amount of tracks or gates connected to tracks outside of each of the blocks. The method is effective whenever there is an alternative layer to which the bridge can be made or whenever another type of protective connection achieving the desired function can be made. The performance of the circuitry within the block is not altered in any way by the protective routing and the external circuit sees the block as a slightly enlarged block with substantially the same port arrangement. The region of protective routing thus de-couples each block from the surrounding circuitry enabling both the blocks and the surrounding circuitry to be developed independently.

Figure 5:
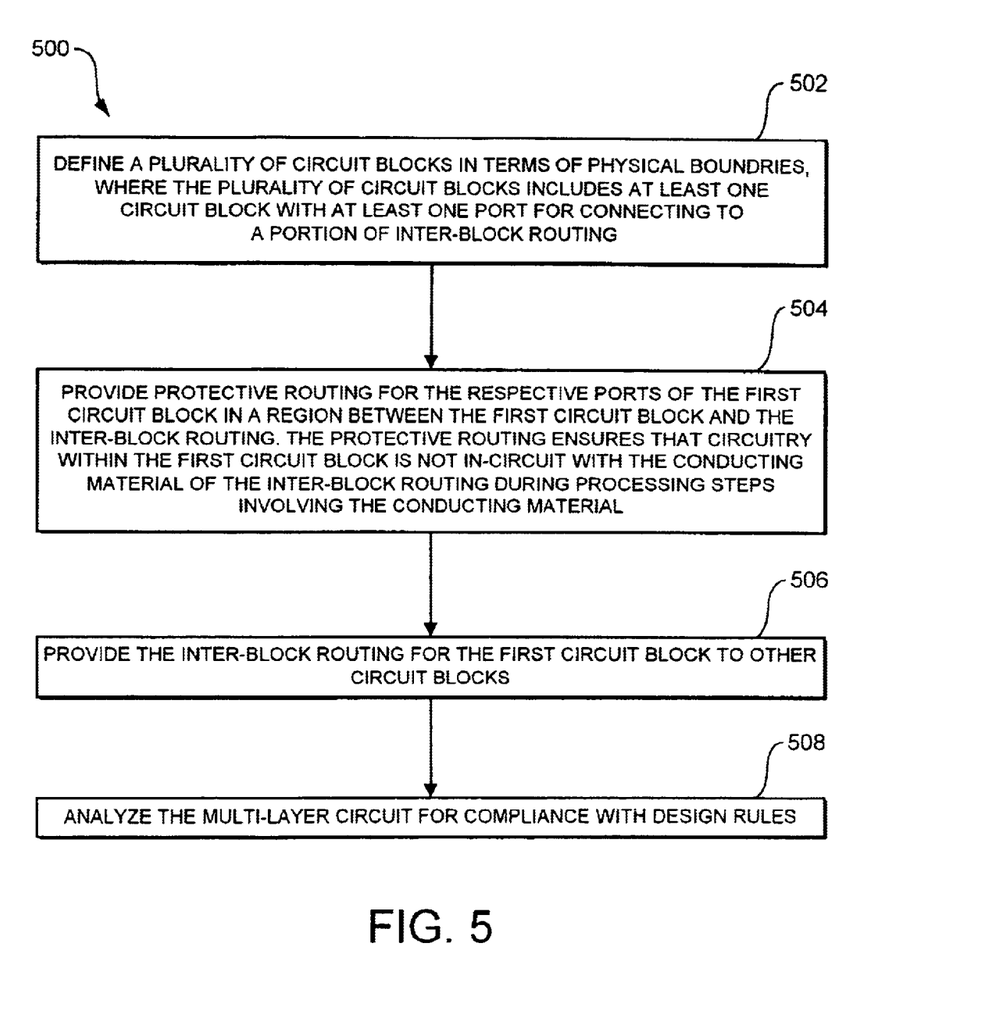
FIG. 5 illustrates a flowchart that describes a method for designing a multi-layer electronic circuit having protective routing according the present invention.

FIG. 5 illustrates a flowchart 500 that describes a method for designing a multi-layer electronic circuit having protective routing according the present invention. The flowchart 500 is further described below.

In step 502, a plurality of circuit blocks are defined in terms of physical boundaries. The plurality of circuit blocks includes at least one circuit block with at least one port that connects a portion of the circuit block to a portion of inter-block routing. The inter-block routing includes conducting material external to the first circuit block. For example, FIG. 2 illustrates that the circuit block B1 is connected to inter-block routing that is external to the circuit block B1.

In one embodiment, the step 502 further includes defining a circuit net from the plurality of circuit blocks. The net includes circuitry (e.g. transistors, capacitors, resistors, etc.) connected together by one or more routing layers in circuit blocks. A net can include circuitry in one or more circuit blocks by connecting ports of respective circuit blocks together by inter-block routing.

In step 504, protective routing is provided for the respective ports of the first circuit block in a region between the first circuit block and the inter-block routing. The protective routing insures that circuitry within the first circuit block is not in-circuit with the conducting material of the inter-block routing during processing steps involving the conducting material.

In step 506, the inter-block routing is provided between respective ports of the first circuit block and one or more ports of the other circuit blocks. The inter-block routing can be defined before, after, or simultaneously with the protective routing, as long as the protective routing for a port is higher than the highest conductive layer on the net connected to a port, including any inter-block routing.

The steps 502–506 are repeated for additional ports in the circuit block, and for other circuit blocks.

In step 508, the multi-layer circuit, including the plurality of circuit blocks, is analyzed for compliance with design rules. In one embodiment, the step of providing protective routing occurs before the step of analyzing the multi-layer circuit.

Figure 6:
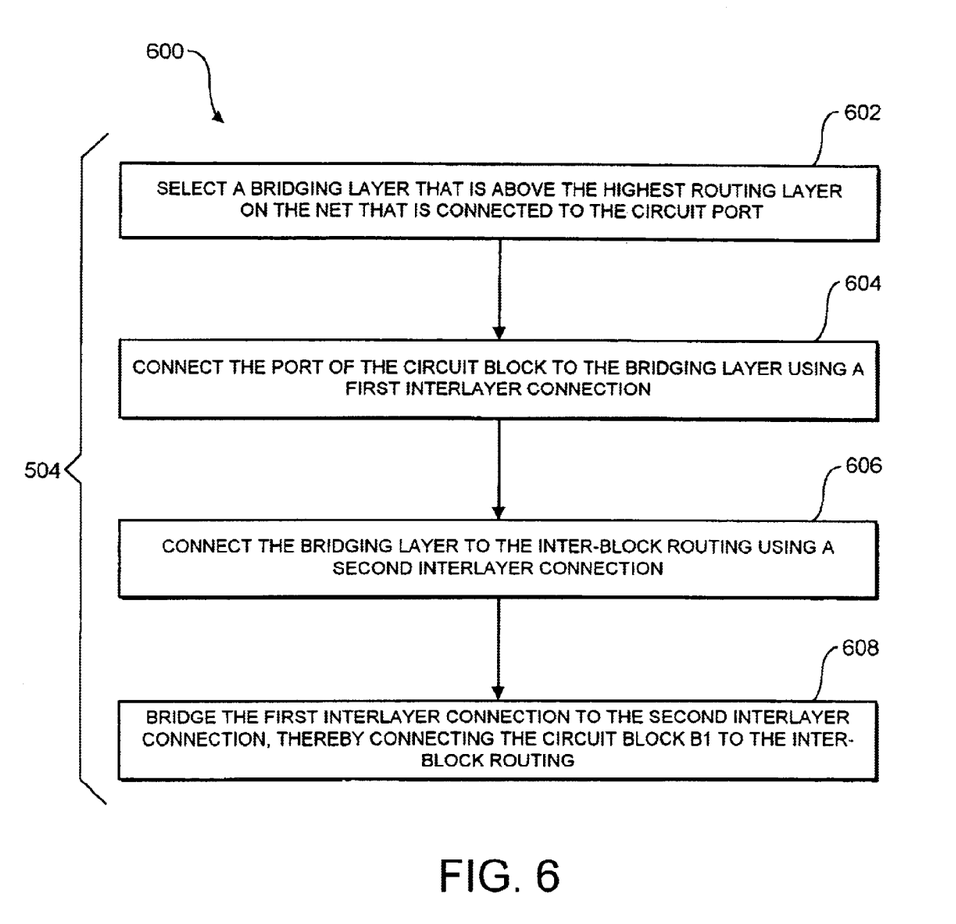
FIG. 6 illustrates a flowchart that further describes the step of providing protective routing in a multi-layer circuit according to the present invention.

FIG. 6 illustrates a flowchart 600 that further defines the step 504 for providing protective routing for a circuit port in a circuit block that is part of a net, and therefore can be connected to other circuit ports in other circuit blocks by inter-block routing. As discussed above, a circuit "net" is formed when a port of one circuit block is connected to one or more ports of at least one other circuit block. The net includes all ports and portions of routing layers that are connected to the ports on net.

In step 602, a bridging layer is selected that is above the highest routing layer associated with the net that is connected to the circuit port. In other words, the bridging layer is selected considering all layers connected to the circuit port from all the circuit blocks on the net. Furthermore, the inter-block routing is also considered. For example, in FIG. 2, the routing layer M3 is the highest routing layer connected to the port P1, either within the circuit block B1 or outside the circuit block B1. Therefore, the upper metal layer m4 is selected in step 604 as the bridging layer because it is above the highest routing layer connected to port P1.

In step 604, the port of the circuit block is connected to the bridging layer using a first interlayer connection. For example, in FIG. 2, the port P1 is connected to the routing layer M4 using a V1 metal connection.

In step 606, the bridging layer of step 604 is connected to the inter-block routing using a second interlayer connection. For example, in FIG. 2, the M4 layer is connected to the inter-block routing using the V2 metal connection.

In step 608, the first interlayer connection is bridged to the second interlayer connection using the bridging layer. For example, in FIG. 2, the V1 metal connection is bridged to the V2 metal connection using the bridge B, thereby connecting the circuit block B1 to the inter-block routing. The bridge B is part of the M4 layer that is fabricated after completion of the M3 layer. Therefore, the circuit block B1 is not connected to any other circuit block on the M3 layer until after the M3 layer fabrication is complete. Therefore, the structures within the block B1 are not subject to antenna effects caused by structures in other blocks or the top level routing.

In one embodiment, the bridging step 608 is performed by isolating the bridge B from the remaining portion of the conductive material in layer M4. This is illustrated in FIG. 2, where the bridge B is physically and electrically isolated from remaining conductive material of layer M4.

Figure 8:
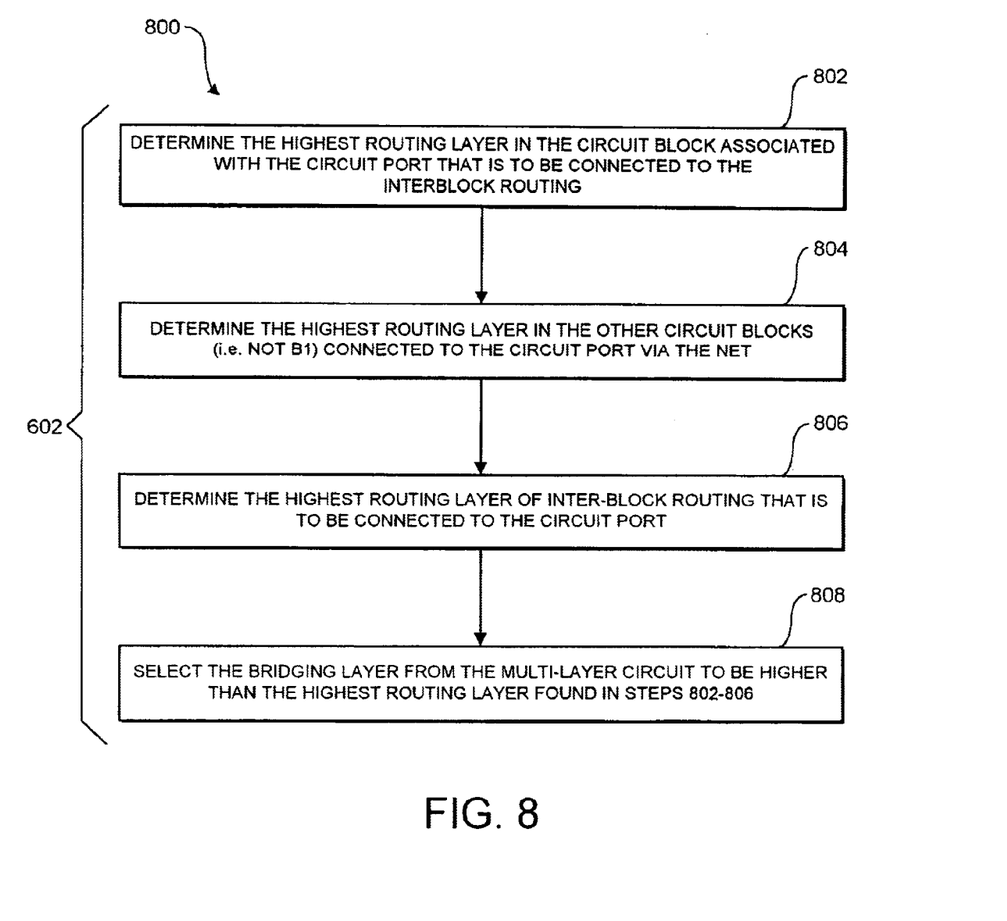
FIG. 8 illustrates a flowchart that further describes the step of selecting a bridging layer.

As discussed above, step 602 selects a bridging layer that is above the highest routing layer associated with the net that is connected to the circuit port. In doing so, all routing layers that are connected to the circuit port should be considered. Therefore, the step 602 can be further described in sub-steps that are illustrated in the flowchart 800. For example, in step 802, the highest routing layer in the circuit block B1 (having the port P1) that is connected to the port P1 is determined. In step 804, the highest routing layer in other circuit blocks (i.e. not B1) connected to the port P1 is determined. In step 806, the highest routing layer of inter-block routing that is to be connected to the port P1 is determined. In step 808, the bridging layer is selected from the multi-layer to be higher than the highest routing layer found in steps 802–806.

In this description, the following meanings apply to terms used to describe the invention. A "cell" is a group of circuit elements arranged to perform a logical function. The term "higher" is used to describe position in relation to the substrate of a multi-layer circuit and should not be construed as limiting. "Inter-block routing" refers to connection between blocks and "block-level routing" (also "sub-block routing") refers to connections within blocks. The term "bridging layer" and "routing layer" are metal layers within the multi-layer circuit. The "bridging layer" connects a port of the circuit block to inter-block routing, and is higher than any routing layer connected to the port.

Those skilled in the art will recognize that the present invention has a broad range of applications, and the various embodiments could incorporate a wide range of modifications, without departure from the inventive concept as set out in the claims. For example, the invention uses an available high metal layer by running fixed routing connections from the port to the high metal layer. The result is a fixed routing portion which would appear as an inverted U-shape in cross-section. However it will be apparent that a modified method could achieve the same result by means of a connection taking any suitable form or cross-sectional shape. Also there are cases where not all of the ports require protection using bridging connections in a halo region, e.g., output ports. This invention can be applied selectively to certain critical nets while leaving others.

Although embodiments of the invention have been explained in terms of high-level blocks and inter-block routing, a skilled person would readily appreciate that the inventive concepts are also applicable to lower-level blocks and lower-level routing in integrated circuits. The inventive concepts are also applicable in other types of integrated circuit design flows as well as outside integrated circuit design in other electrical circuit design fields.

Therefore while the foregoing has described what is considered to be the best mode for forming the invention, it is understood that various modifications may be made therein and that the invention may be implemented in various forms and embodiments, and that it may be applied in various applications, only some of which have been described herein. It is intended by the following claims to claim any and all modifications and variations that fall within the true scope of the inventive concept.

Figure 7:
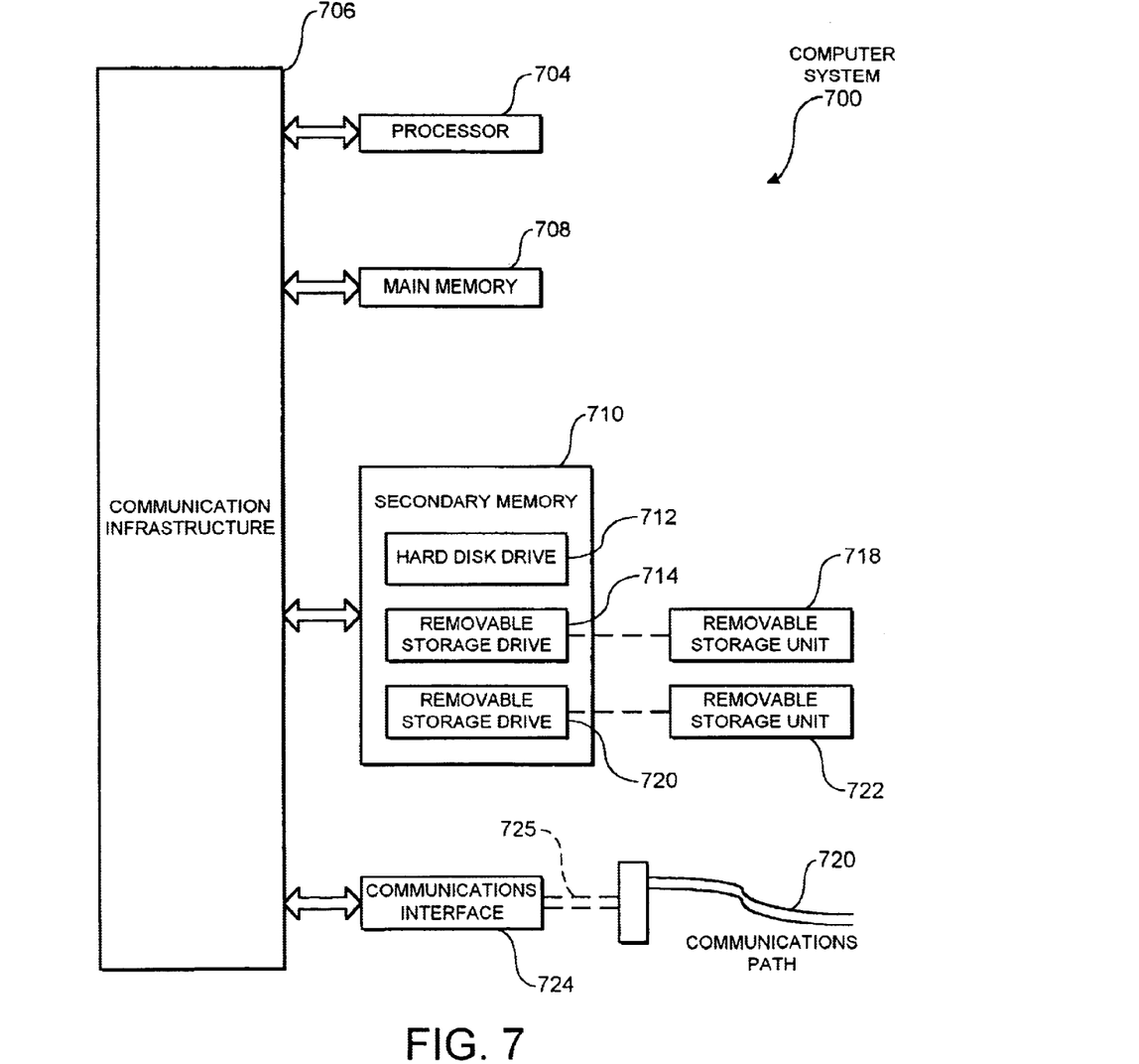
FIG. 7 illustrates an exemplary computer system that can perform the circuit design method described herein.

FIG. 7 illustrates an example computer system 700, in which the present invention can be implemented as computer-readable code. Various embodiments of the invention are described in terms of this example computer system 700. After reading this description, it will become apparent to a person skilled in the relevant art how to implement the invention using other computer systems and/or computer architectures.

The computer system 700 includes one or more processors, such as processor 704. Processor 704 can be a special purpose or a general purpose digital signal processor. The processor 704 is connected to a communication infrastructure 706 (for example, a bus or network). Various software implementations are described in terms of this exemplary computer system. After reading this description, it will become apparent to a person skilled in the relevant art how to implement the invention using other computer systems and/or computer architectures.

Computer system 700 also includes a main memory 708, preferably random access memory (RAM), and may also include a secondary memory 710. The secondary memory 710 may include, for example, a hard disk drive 712 and/or a removable storage drive 714, representing a floppy disk drive, a magnetic tape drive, an optical disk drive, etc. The removable storage drive 714 reads from and/or writes to a removable storage unit 718 in a well known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative implementations, secondary memory 710 may include other similar means for allowing computer programs or other instructions to be loaded into computer system 700. Such means may include, for example, a removable storage unit 722 and an interface 720. Examples of such means may include a program cartridge and cartridge interface (such as that found in video game devices), a removable memory chip (such as an EPROM, or PROM) and associated socket, and other removable storage units 722 and interfaces 720 which allow software and data to be transferred from the removable storage unit 722 to computer system 700.

Computer system 700 may also include a communications interface 724. Communications interface 724 allows software and data to be transferred between computer system 700 and external devices. Examples of communications interface 724 may include a modem, a network interface (such as an Ethernet card), a communications port, a PCM-CIA slot and card, etc. Software and data transferred via communications interface 724 are in the form of signals 728 which may be electronic, electromagnetic, optical or other signals capable of being received by communications interface 724. These signals 728 are provided to communications interface 724 via a communications path 726. Communications path 726 carries signals 728 and may be implemented using wire or cable, fiber optics, a phone line, a cellular phone link, an RF link and other communications channels.

In this document, the terms "computer program medium" and "computer usable medium" are used to generally refer to media such as removable storage drive 714, a hard disk installed in hard disk drive 712, and signals 728. Computer program medium and computer usable medium can also refer to memories, such as main memory 808 and secondary memory 710, that can be memory semiconductors (e.g. DRAMs, etc.) These computer program products are means for providing software to computer system 700.

Computer programs (also called computer control logic) are stored in main memory 708 and/or secondary memory 710. Computer programs may also be received via communications interface 724. Such computer programs, when executed, enable the computer system 700 to implement the present invention as discussed herein. In particular, the computer programs, when executed, enable the processor 704 to implement the processes of the present invention, such as the circuit design method described by flowcharts 500, 600, and 800 above. Accordingly, such computer programs represent controllers of the computer system 700. Where the invention is implemented using software, the software may be stored in a computer program product and loaded into computer system 700 using removable storage drive 714, hard drive 712 or communications interface 724.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method of circuit design for a multi-layer circuit, comprising:

defining one circuit block of a plurality of circuit blocks in the multi-layer circuit, the one circuit block having a port for connecting a portion of the circuit block to inter-block routing;

determining routing layers in the plurality of circuit blocks that are connected to the port of the one circuit block;

selecting a bridging layer that is a conducting layer of the multi-layer circuit such that the bridging layer is farther from a substrate of the multi-layer circuit than any routing layer connected to the port of the one circuit block;

connecting the port to the bridging layer using a first interlayer connection;

connecting the bridging layer to the inter-block routing using a second interlayer connection; and isolating a portion of the conducting layer from the rest of the bridging layer, the isolated portion defined between the first interlayer connection and the second interlayer connection.

2. The method of claim 1, wherein connecting the bridging layer to the inter-block routing includes connecting the first interlayer connection to the second interlayer connection using the bridging layer.

3. The method of claim 1, further comprising the step of connecting a second circuit block of the plurality of circuit blocks to the inter-block routing.

4. The method of claim 1, wherein the step of selecting a bridging layer of the multi-layer circuit includes the steps of:

determining a routing layer farthest from the substrate of the multi-layer circuit in the one circuit block that is connected to the port;

determining a routing layer farthest from the substrate of the multi-layer circuit in other circuit blocks of the plurality of circuit blocks that are to be connected to the port of the one circuit block;

determining a routing layer, farthest from the substrate of the multi-layer circuit, of the inter-block routing that is to be connected to the one port of the one circuit block; and selecting the bridging layer to be farther from the substrate than the farthest layer identified in the prior determining steps.

5. The method of claim 1, further comprising the step of analyzing the multi-layer circuit including the plurality of circuit blocks for compliance with one or more design rules, wherein the step of analyzing the multi-layer circuit occurs in response to the step of connecting the bridging layer to inter-block routing.

6. A computer program product embodied on a computer program medium having computer program code for designing a multi-layer circuit, the computer program code comprising:

means for causing a computer to define a plurality of circuit blocks, each circuit block having one or more routing layers and at least one port;

means for causing the computer to define a net from the plurality of circuit blocks, the net having a plurality of the ports from the plurality of circuit blocks that are to be connected by inter-block routing;

means for causing the computer to determine a bridging layer for one port of the plurality of ports, the bridging layer being a conducting layer that is farther from a substrate of the multi-layer circuit than any routing layer on the net that is connected to the one port; and means for causing the computer to isolate a portion the conducting layer from the rest of the bridging layer, the isolated portion defined between a first interlayer connection and a second interlayer connection.

7. The computer program product of claim 6, the computer program code further comprising:

means for causing the computer to connect the one port of the plurality of ports to the bridging layer using a first interlayer connection; and means for causing the computer to connect the bridging layer to the inter-block routing using a second interlayer connection.

8. The computer program product of claim 6, the computer program code further comprising a means for analyzing the multi-layer circuit including the circuit blocks for compliance with one or more design rules, in response to determining the bridging layer.

9. A multi-layer circuit, comprising:

a first circuit block having one or more first routing layers and a first port connected to at least one of the first routing layers;

inter-block routing connecting the first port to a second circuit block of the multi-layer circuit, the second circuit block having one or more second routing layers;

a bridging layer that is a conducting layer located farther from a substrate of the multi-layer circuit than the one or more first routing layers that are connected to said first port, the bridging layer also located farther from the substrate than the one or more second routing layers of the second circuit block;

a first interlayer connection connecting the first port to the bridging layer; and a second interlayer connection connecting the bridging layer to the inter-block routing, wherein the bridging layer includes a portion of the conducting layer isolated from the rest of the bridging layer, the isolated portion defined between the first interlayer connection and the second interlayer connection.

10. A method of circuit design for a multi-layer circuit having a plurality of circuit blocks, the method comprising:

defining a net having a plurality of ports from the plurality of circuit blocks that are to be connected by inter-block routing;

selecting a bridging layer for one port of the plurality of ports of the net, the bridging layer being a conducting layer farther from a substrate of the multi-layer circuit than any routing layer on the net that is connected to the one port;

connecting the one port of the circuit block to the bridging layer using a first interlayer connection;

connecting the bridging layer to the inter-block routing using a second interlayer connection; and isolating a portion of the conducting layer from the rest of the bridging layer, the isolated portion defined between the first interlayer connection and the second interlayer connection.

11. A method of circuit design for a multi-layer circuit, comprising:

defining one circuit block of a plurality of circuit blocks in the multi-layer circuit, the one circuit block having a port for connecting a portion of the circuit block to inter-block routing;

determining routing layers in the plurality of circuit blocks that are connected to the port of the one circuit block;

selecting a bridging layer that is a conducting layer of the multi-layer circuit such that the bridging layer is farther from a substrate of the multi-layer circuit than any routing layer connected to the port of the one circuit block;

connecting the port to the bridging layer using a first interlayer connection;

connecting the bridging layer to the inter-block routing using a second interlayer connection; and isolating a portion of the bridging layer from the rest of the bridging layer, the isolated portion defined between the first interlayer connection and the second interlayer connection;

wherein the step of selecting the bridging layer of the multi-layer circuit includes the steps of:

determining a routing layer farthest from the substrate of the multi-layer circuit in the one circuit block that is connected to the port;

determining a routing layer farthest from the substrate of the multi-layer circuit in other circuit blocks of the plurality of circuit blocks that are to be connected to the port of the one circuit block;

determining a routing layer, farthest from the substrate of the multi-layer circuit, of the inter-block routing that is to be connected to the one port of the one circuit block; and selecting the bridging layer to be farther from the substrate than the farthest layer identified in the prior determining steps.

* * * * *